(12) United States Patent
Gradečak et al.

(10) Patent No.: US 8,389,393 B2
(45) Date of Patent: Mar. 5, 2013

(54) NANOPARTICLE SYNTHESIS

(75) Inventors: Silvija Gradečak, Cambridge, MA (US); Chun-Hao Tseng, Taichung (TW); Sung Keun Lim, Revere, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 48 days.

(21) Appl. No.: 12/511,634

(22) Filed: Jul. 29, 2009

(65) Prior Publication Data

US 2011/0024723 A1 Feb. 3, 2011

(51) Int. Cl.
*H01L 21/28* (2006.01)
*H01L 21/3205* (2006.01)

(52) U.S. Cl. .. 438/606; 977/815; 977/893; 257/E21.295

(58) Field of Classification Search ............ 977/815, 977/893; 438/584, 606; 257/E21.295
See application file for complete search history.

(56) References Cited

U.S. PATENT DOCUMENTS

| | | | | |
|---|---|---|---|---|
| 5,128,207 A | * | 7/1992 | Formanek et al. | 428/339 |
| 7,850,941 B2 | * | 12/2010 | Tsakalakos et al. | 423/445 R |
| 2003/0089899 A1 | * | 5/2003 | Lieber et al. | 257/9 |
| 2004/0150311 A1 | * | 8/2004 | Jin | 313/309 |
| 2005/0082543 A1 | * | 4/2005 | Alizadeh et al. | 257/79 |
| 2005/0164432 A1 | * | 7/2005 | Lieber et al. | 438/149 |
| 2007/0111460 A1 | * | 5/2007 | Mosley et al. | 438/381 |
| 2009/0233236 A1 | * | 9/2009 | Black et al. | 430/311 |

OTHER PUBLICATIONS

Carraro et al. (Metallization and nanostructuring of semiconductor surfaces by galvanic displacement processes o Review article Surface Science Reports, vol. 62, Issue 12, Dec. 2007, pp. 499-525).*

Aizawa, M. & Buriak, J. M., Block copolymer templated chemistry for the formation of metallic nanoparticle arrays on semiconductor surfaces. *Chemistry of Materials* 19, 5090-5101 (2007).

Aizawa, M. & Buriak, J. M., Block copolymer-templated chemistry on Si, Ge, InP, and GaAs surfaces. *J. Am. Chem. Soc.* 127, 8932-8933 (2005).

Cui, Y., Lauhon, L. J., Gudiksen, M. S., Wang, J. F. & Lieber, C. M., *Applied Physics Letters* 78, 2214-2216 (2001).

Gao, D. et al., Selective growth of Si nanowire arrays via galvanic displacement processes in water-in-oil microemulsions. *J. Am. Chem. Soc.* 127, 4574-4575 (2005).

Hang, Q. L., Hill, D. A. & Bernstein, G. H., Efficient removers for poly(methylmethacrylate). *Journal of Vacuum Science & Technology B* 21, 91-97 (2003).

Kraus, T. et al., Nanoparticle printing with single-particle resolution. *Nature Nanotech.* 2, 570-576 (2007).

Liao, J., Bernard, L., Langer, M., Schönenberger, C. & Calame, M., Reversible formation of molecular junctions in 2D nanoparticle arrays. *Adv. Mater.* 18, 2444-2447 (2006).

(Continued)

Primary Examiner — Jarrett Stark

(74) Attorney, Agent, or Firm — Steptoe & Johnson LLP

(57) ABSTRACT

A noble metal nanoparticle can be grown on a semiconductor substrate by contacting a predetermined region of the substrate with a solution including noble metal ions. The predetermined region of the semiconductor substrate can be exposed by applying a polymeric layer over the substrate selectively removing a portion of the polymeric layer. The nanoparticles can be prepared in a predetermined pattern. The nanoparticle can be formed with a barrier separating it from another nanoparticle on the substrate; for example, nanoparticle can be located in a pit etched in the substrate. The size and location of the nanoparticle can be stable at elevated temperatures.

16 Claims, 6 Drawing Sheets

OTHER PUBLICATIONS

Magagnin, L., Maboudian, R. & Carraro, C., Selective deposition of thin copper films onto silicon with improved adhesion. *Electrochem. Solid-State Lett.* 4, C5-C7 (2001).

Maier, S. A. et al., Plasmonics—a route to nanoscale optical devices. *Adv. Mater.* 13, 1501-1505 (2001).

Mårtensson, T., Borgström, M., Seifert, W., Ohlsson, B. J. & Samuelson, L., *Nanotechnology* 14, 1255-1258 (2003).

Mikkelsen, A. et al., *Nanotechnology* 16, 2354-2359 (2005).

Nezhad, M. R. H., Aizawa, M., Porter, L. A., Ribbe, A. E. & Buriak, J. M., Synthesis and patterning of gold nanostructures on InP and GaAs via galvanic displacement. *Small* 1, 1076-1081 (2005).

Nguyen, P., Ng, H. T. & Meyyappan, M., *Adv. Mater.* 17, 1773-1777 (2005).

Oskam, G., Long, J. G., Natarajan, A. & Searson, P. C., Electrochemical deposition of metals onto silicon. *Journal of Physics D—Applied Physics* 31, 1927-1949 (1998).

Sayed, S. Y., Daly, B. & Buriak, J. M., Characterization of the interface of gold and silver nanostructures on InP and GaAs synthesized via galvanic displacement. *J. Phys. Chem. C* 112, 12291-12298 (2008).

Schmid, H. et al., Patterned epitaxial vapor-liquid-solid growth of silicon nanowires on Si(111) using silane. *Journal of Applied Physics* 103, 024304(024301-024307) (2008).

Song, J. S. et al., Wet chemical cleaning process of GaAs substrate for ready-to-use. *Journal of Crystal Growth* 264, 98-103 (2004).

Song, Y. Y., Gao, Z. D., Kelly, J. J. & Xia, X. H., Galvanic deposition of nanostructured noble-metal films on silicon. *Electrochemical and Solid State Letters* 8, C148-C150 (2005).

Coluccio, M. L. et al., "Silver-based surface enhanced Raman scattering (SERS) substrate fabrication using nanolithography and site selective electroless deposition," *Microelectronic Engineering*, vol. 86, No. 4-6, Apr. 1, 2009, pp. 1085-1088.

Porter, L.A., Jr. et al., "Metallic nanostructures via static plowing lithography," *Nano Letters*, vol. 3, No. 8, Aug. 8, 2003, pp. 1043-1047.

Aizawa, M. et al., "Block Copolymer-Templated Chemistry on Si, Ge, InP, and GaAs Surfaces," *Journal of the American Chemical Society*, vol. 127, Jun. 6, 2005, pp. 8932-8933.

Hormozi Nezhad, M. R. et al., "Synthesis and patterning of gold nanostructures on InP and GaAs via galvanic displacement," *Small*, vol. 1, No. 11, Nov. 1, 2005, pp. 1076-1081.

Magagnin, L. et al., "Selective deposition of gold nanoclusters on silicon by a galvanic displacement process," *Microelectronic Engineering*, vol. 64, No. 1-4, Oct. 1, 2002, pp. 479-485.

Magagnin, L. et al., "Gold deposition by galvanic displacement on semiconductor surfaces: effect of substrate on adhesion," *J. Phys. Chem.*, vol. 106, Dec. 19, 2001, pp. 401-407.

International Report on Patentability, PCT/US2010/042942, mailed Feb. 9, 2012.

Tseng et al., "Position controlled nanowire growth through Au nanoparticles synthesized by galvanic reaction," (2010) *Nanotechnology*, 21:165605.

\* cited by examiner

NANOPARTICLE SYNTHESIS

FEDERALLY SPONSORED RESEARCH OR DEVELOPMENT

This invention was made with government support under Grant No. DMR-0745555, awarded by the NSF. The government has certain rights in this invention.

TECHNICAL FIELD

The present invention relates to nanoparticles and methods of making them.

BACKGROUND

Nanoparticles can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Colloidal gold nanoparticles, are a suspension (or colloid) of sub-micrometer-sized particles of gold in a fluid, usually water. The nanoparticles can have a variety of shapes, including spheres, rods, cubes, and other shapes. Generally, gold nanoparticles are produced in a liquid by reduction of chloroauric acid, $HAuCl_4$. Galvanic reactions where a substrate acts as the reducing agent can produce colloidal Au nanoparticles that can be well controlled for size, but generally with little or no control over nanoparticle location on a substrate.

SUMMARY

In one aspect, a method of growing a nanoparticle on a substrate can include contacting a predetermined region of a semiconductor substrate with a solution including noble metal ions.

The method can include various optional features. For example, the method can further include exposing the predetermined region of the semiconductor substrate, wherein exposing includes applying a polymeric layer over the semiconductor substrate and selectively removing the polymeric layer. In certain embodiments, the substrate can include GaAs. The polymeric layer can include PMMA. The noble metal can be Au. The nanoparticle can be a nanocrystal. In certain embodiments, exposing a portion of the substrate through the polymeric layer can include e-beam lithography. In certain embodiments, the nanoparticle can be a member of a nanoparticle population having an average diameter of 25 nm or smaller, or of 10 nm or smaller. Contacting a predetermined region of a semiconductor substrate with a solution including noble metal ions can include forming a nanoparticle on the substrate, the nanoparticle being laterally separated from other nanoparticles on the substrate by a barrier. The barrier can include a portion of the substrate that is raised relative to the region of the substrate upon which the nanoparticle is positioned. In certain embodiments, the nanoparticle can be positioned in a pit on the substrate. In certain embodiments, removing a portion of the polymeric layer can include forming a pattern. The pattern can be an array of openings. The openings in the array can have a dimension of 1 nm or less, 5 nm or less, 10 nm or less, 25 nm or less, or a larger dimension.

In another aspect, a composition may include a noble metal nanoparticle positioned on a predetermined region of a semiconductor substrate, the noble metal nanoparticle being separated from another nanoparticle on the substrate by a barrier.

The composition can include various optional features. For example, the barrier can include a polymeric material. In certain embodiments, the barrier is raised relative to the region of the substrate upon which the nanoparticle is positioned. In certain embodiments, the substrate is GaAs. In certain embodiments, the polymeric material is PMMA. In certain embodiments, the nanoparticle is a nanocrystal. In certain embodiments, the noble metal is Au. In certain embodiments, the nanoparticle has a diameter of 25 nm or smaller, or 10 nm or smaller.

In another aspect, a nanomaterial including a noble metal nanocrystal and an amorphous layer of a semiconductor material at least partially surrounding the nanoparticle.

The nanomaterial can include various optional features. For example, the noble metal is Au. In certain embodiments, the average diameter of the nanocrystal is of 25 nm or smaller, or of 10 nm or smaller. In certain embodiments, the amorphous layer includes an oxide. The oxide can be derived from the semiconductor material.

The details of one or more embodiments are set forth in the accompanying drawings and description below. Other features, objects, and advantages will be apparent from the description and drawings.

DESCRIPTION OF DRAWINGS

FIGS. 1A-1C describe results obtained with unpatterned substrates.

FIG. 3A is an AFM image and height profile of the patterned dot array. Inset is the corresponding 3D AFM image. FIG. 3B if a bright-field TEM image of an Au nanoparticle removed from patterned substrate. FIG. 3C is a high-resolution TEM image at the boundary of the particle showing three distinct structural regions. FIG. 3D is a dark-field STEM image and corresponding elemental mapping of Au nanoparticles, indicating spatial distribution of Au, Ga, and As.

DETAILED DESCRIPTION

One common method of nanowire synthesis is the vapor-liquid-solid (VLS) process that involves a seed particle. The seed particle acts as a catalyst, and defines the nanowire position and diameter. Gold (Au) nanoparticles are frequently used as catalysts for synthesis of nanowires of various compositions. Current methods of gold nanoparticle deposition are limited in control over nanoparticle size and/or position. See, for example, Nguyen, P., Ng, H. T. & Meyyappan, M., Adv. Mater. 17, 1773-1777 (2005), which is incorporated by reference in its entirety. For example, colloidal Au nanoparticles can be well controlled for size, but particle position is uncontrolled. The deposition process of colloidal Au nanoparticles can involve organic adhesion layers between the substrate and the Au nanoparticles. See, for example, Cui, Y., Lauhon, L. J., Gudiksen, M. S., Wang, J. F. & Lieber, C. M., Applied Physics Letters 78, 2214-2216 (2001); and Mikkelsen, A. et al., Nanotechnology 16, 2354-2359 (2005), each of which is incorporated by reference in its entirety.

Positional control can be achieved for Au nanoparticles by first patterning the substrate using e-beam lithography (EBL) and subsequent Au deposition using physical vapor deposition (PVD). In this method, poor adhesion of Au to the growth substrate can interfere with the deposition of small diameter Au islands. See, for example, Mårtensson, T., Borgström, M., Seifert, W., Ohlsson, B. J. & Samuelson, L., Nanotechnology 14, 1255-1258 (2003), which is incorporated by reference in its entirety. Maintaining control over the nanoparticle positions can be difficult, because significant Au diffusion on the semiconductor substrates may occur during the annealing process. The diffusion may be especially troublesome for small Au particles. See, for example, Kraus, T. et al., Nanoparticle printing with single-particle resolution. Nature Nanotech. 2, 570-576 (2007); and Schmid, H. et al., Patterned epitaxial vapor-liquid-solid growth of silicon nanowires on Si(111) using silane. Journal of Applied Physics 103, 024304 (024301-024307) (2008), each of which is incorporated by reference in its entirety. Selectively synthesis of catalytic nanoparticles with controllable diameter, shape, and position can therefore be desirable for development of nanowire technology and broaden future applications of metal nanostructures. See, for example, Kraus, T. et al., Nanoparticle printing with single-particle resolution. Nature Nanotech. 2, 570-576 (2007); Maier, S. A. et al., Plasmonics—a route to nanoscale optical devices. Adv. Mater. 13, 1501-1505 (2001); and Liao, J., Bernard, L., Langer, M., Schönenberger, C. & Calame, M., Reversible formation of molecular junctions in 2D nanoparticle arrays. Adv. Mater. 18, 2444-2447 (2006), each of which in incorporated by reference in its entirety.

Figure 2:
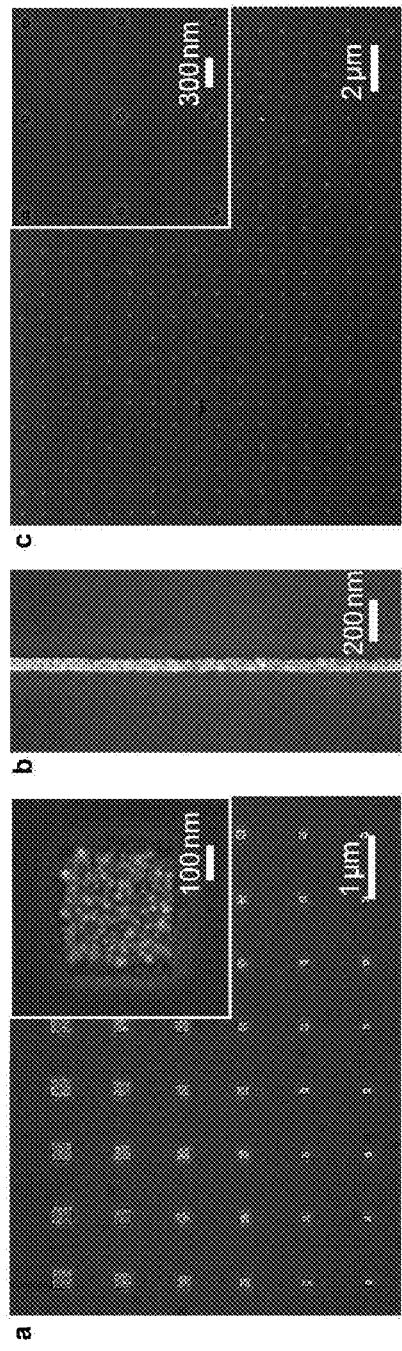
FIG. 2A is a SEM image of an array of squares of decreasing size, ranging from $320 \times 320$ $nm^2$ to $80 \times 80$ $nm^2$ EBL-defined Au patterns produced using the galvanic reaction.
FIG. 2B is a SEM image of a line pattern with an average width of 70 nm and 10 µm length.
FIG. 2C is an SEM image of a large-scale dot array with an average diameter of ~25 nm. Inset is a higher magnification image. All samples are shown after lift-off processes.

A simple and efficient electrochemical reaction can selectively synthesize Au nanoparticles on GaAs substrates using a galvanic reaction. See, for example, Aizawa, M. & Buriak, J. M., Block copolymer-templated chemistry on Si, Ge, InP, and GaAs surfaces. J. Am. Chem. Soc. 127, 8932-8933 (2005); Nezhad, M. R. H., Aizawa, M., Porter, L. A., Ribbe, A. E. & Buriak, J. M., Synthesis and patterning of gold nanostructures on InP and GaAs via galvanic displacement. Small 1, 1076-1081 (2005); Gao, D. et al., Selective growth of Si nanowire arrays via galvanic displacement processes in water-in-oil microemulsions. J. Am. Chem. Soc. 127, 4574-4575 (2005); Sayed, S. Y., Daly, B. & Buriak, J. M., Characterization of the interface of gold and silver nanostructures on InP and GaAs synthesized via galvanic displacement. J. Phys. Chem. C 112, 12291-12298 (2008), each of which is incorporated by reference in its entirety. Metal nanoparticles can be selectively prepared at predetermined locations on a substrate by patterning the substrate prior to the galvanic reaction. Patterning can be carried out, for example, by selectively removing regions of a polymer coating on a substrate by EBL. The predetermined locations can be chosen so as to form, for example, an ordered array, a line, or other shapes or patterns. The dimensions of the shapes or patterns can be of any size attainable by EBL; for example, a dimension of 1 nm or less, 5 nm or less, 10 nm or less, 25 nm or less, or a larger dimension. As one example, FIGS. 2B and 2C show that the pattern can have features of less than 100 nm in size (i.e., a line that is 70 nm wide, and spots with an average diameter of ~25 nm, respectively). This approach allows for the creation of ordered arrays of metal nanoparticles without the use of external reducing agents, organic solvents, or strong acids. Diffusion of metal nanoparticles at high temperature annealing steps can be limited by the local environment surrounding the nanoparticles. For example, confining the galvanic reaction to a small region of exposed substrate can lead to spontaneous formation of pits surrounding each nanoparticle. The pits can retain the nanoparticles at temperatures used for annealing, thereby preventing diffusion of the metal nanoparticles.

EXAMPLES

Au nanoparticles on bare, non-patterned GaAs substrates were first synthesized using a galvanic reaction. A GaAs substrate was immersed in an $Au^{+3}$ solution (as $HAuCl_4$) to initiate the galvanic reaction. The $Au^{+3}$ solutions were prepared by dissolving hydrogen tetrachloroaurate (III) trihydrate (Alfa Aesar Co.) into deionized water. Prior to the galvanic reaction, all the GaAs substrates were immersed in a 2% (v/v) aqueous hydrofluoric acid (HF) solution for 5 min to remove the native oxide layer. For unpatterned samples, cleaned GaAs [100]B substrates were rinsed with deionized (DI) water and dried with a $N_2$ flow. Then, the cleaned substrates were immersed in the $Au^{+3}$ solution with different reaction concentrations ($10^{-4}$, $10^{-5}$, $5 \times 10^{-5}$ and $10^{-6}$ M) to start the galvanic reaction. For patterned samples, the patterned GaAs [111]B substrates patterned using EBL were immersed in $Au^{+3}$ solution of $5 \times 10^{-5}$ for 20 min. The $Au^{+3}$ ions diffused to the surface of the GaAs substrate due to the concentration equilibrium effect. Once the $Au^{+3}$ ions contacted the surface directly, a spontaneous reduction occurred due to the difference in the standard reduction potential (the $Au^{+3}/Au$ pair, 1.42 V versus a normal hydrogen electrode (NHE) is higher than those of $Ga^{+3}/Ga$, −0.56 V versus NHE, and the $As^{+3}/As$ pairs, 0.234 V versus NHE). See, for example, Sun, Y. G. & Wiederrecht, G. P., Surfactantless synthesis of silver nanoplates and their application in SERS. Small 3, 1964-1975 (2007), which is incorporated by reference in its entirety. The $Au^{+3}$ ions accept electrons from the bonding electrons of the GaAs substrate (valence band) forming Au nanoparticles and producing gallium and arsenic oxide on the surface of the GaAs substrate. See, for example, Oskam, G., Long, J. G., Natarajan, A. & Searson, P. C., Electrochemical deposition of metals onto silicon. Journal of Physics D-Applied Physics 31, 1927-1949 (1998), which has been incorporated by reference in its entirety. After the reaction, all the samples were thoroughly washed by DI water to remove the residual $Au^{+3}$ ions.

Figure 1:
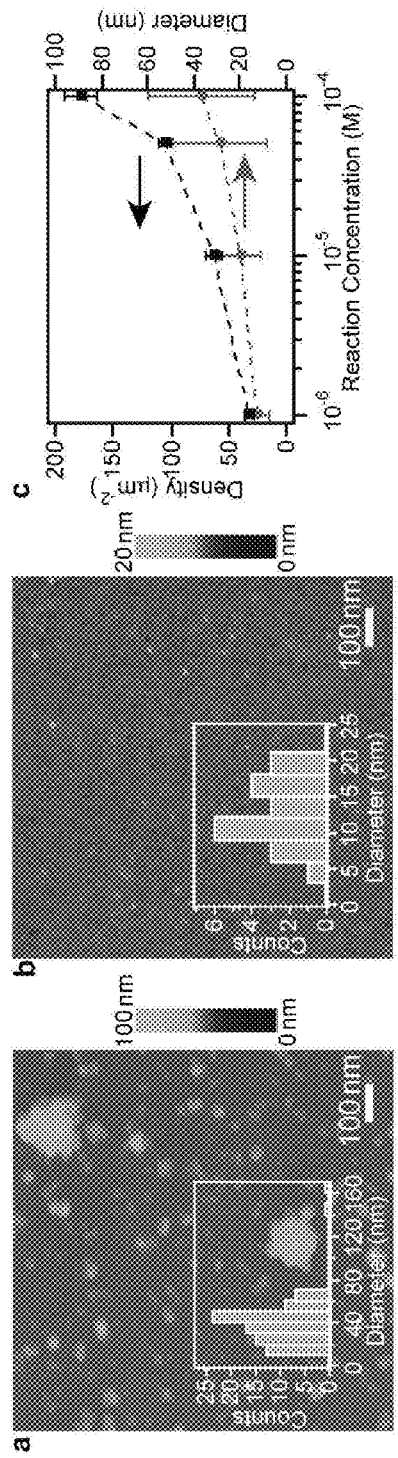
FIG. 1A is an AFM image and diameter distribution of the Au nanoparticles with the $Au^{+3}$ reaction concentration of $10^{-4}$ M.
FIG. 1B is an AFM image and diameter distribution of the Au nanoparticles with the $Au^{+3}$ reaction concentration of $5 \times 10^{-5}$ M.
FIG. 1C is a graph depicting nanoparticle diameter and spatial density as a function of the $Au^{+3}$ reaction concentration.

The influence of the $Au^{+3}$ ion concentration and the reaction time was investigated. FIGS. 1A and 1B show atomic force microscopy (AFM) images of Au nanoparticles on a GaAs substrate prepared at $Au^{+3}$ reaction concentrations of $10^{-4}$ M and $5 \times 10^{-5}$ M, respectively. Reaction time was fixed at 5 min. FIG. 1C shows that both the diameter and spatial density of the Au nanoparticles decrease with the decreasing $Au^{+3}$ reaction concentration. The mean particle diameters decrease from 37±23 nm to 13±5 nm and the density decreases from 178 $\mu m^{-2}$ to 33 $\mu m^{-2}$ as the $Au^{+3}$ concentration changes from $10^{-4}$ M to $10^{-6}$ M. Next, Au nanoparticles were deposited at a constant $Au^{+3}$ reaction concentration of $10^{-4}$ M with reaction times of 10 min, 5 min, and 1 min. The diameter and density of the Au nanoparticles can easily be controlled by changing the reaction time and concentrations during the galvanic reaction.

While the galvanic process by itself provides some level of size and density control, the positions of the Au nanoparticles on the substrate are uncontrolled. To provide positional control, predefined regions of PMMA-covered GaAs substrates were exposed using EBL to form an array of square openings with varying sizes from 80×80 $\mu m^2$ to 320×320 $\mu m^2$. See FIGS. 2A-2C.

The samples for the electron-beam lithography were prepared by first dispersing 950K-PMMA on the GaAs(111)B substrate by spin coating and baking on a 180° C. hotplate for 3 min before EBL exposure. The thickness of the coated PMMA was about 50 nm as measured by a profilometer. All samples were exposed on a Raith-150 scanning EBL system at an accelerating voltage of 30 keV with a dot dose of 0.04 pAs/cm. The exposed PMMA was developed in a 2:1 isopropanol:methylisobutylketone (IPA:MIBK) solution for 90 s at 21° C. and further rinsed in the IPA solution for another 30 s. The lift-off process was performed by immersing the samples in a 1,2-dichloroethane (DCE) solution followed by $O_2$ plasma ashing. See, for example, Hang, Q. L., Hill, D. A. & Bernstein, G. H., Efficient removers for poly(methylmethacrylate). *Journal of Vacuum Science & Technology B* 21, 91-97 (2003), which is incorporated by reference in its entirety.

FIG. 2A shows that the galvanic reaction proceeded only on the exposed substrate regions, while it was inhibited on the PMMA-covered areas. Accordingly, Au nanoparticle growth followed the designed pattern. Within each square feature were many small Au nanoparticles with diameters in the range of 10-20 nm (FIG. 2A, inset), indicating that the growth of Au nanoparticles on the patterned sites started from small nuclei and then conformed to the EBL-defined area. This approach was also successfully applied to the fabrication of a line pattern. FIG. 2B shows a Au line having a width of 70 nm and length of 10 μm demonstrating the potential to create high quality patterns of Au with controlled sizes and specific shapes using the galvanic method. FIG. 2C shows a large-scale array of Au nanoparticles with an average diameter of ~25 nm and spacing of 1 μm. The array was produced using EBL and the galvanic process with a growth yield close to 100% over a 100×100 $\mu m^2$ area. The results indicated that as-grown Au nanoparticles have a strong bonding force to the GaAs substrate, and are not influenced by the removal of the e-beam resist, unlike PVD-produced Au films. Significantly, no adhesion agent was necessary and Au nanoparticles with a small diameter distribution grew uniformly and tightly on the patterned GaAs substrate.

Figure 3:
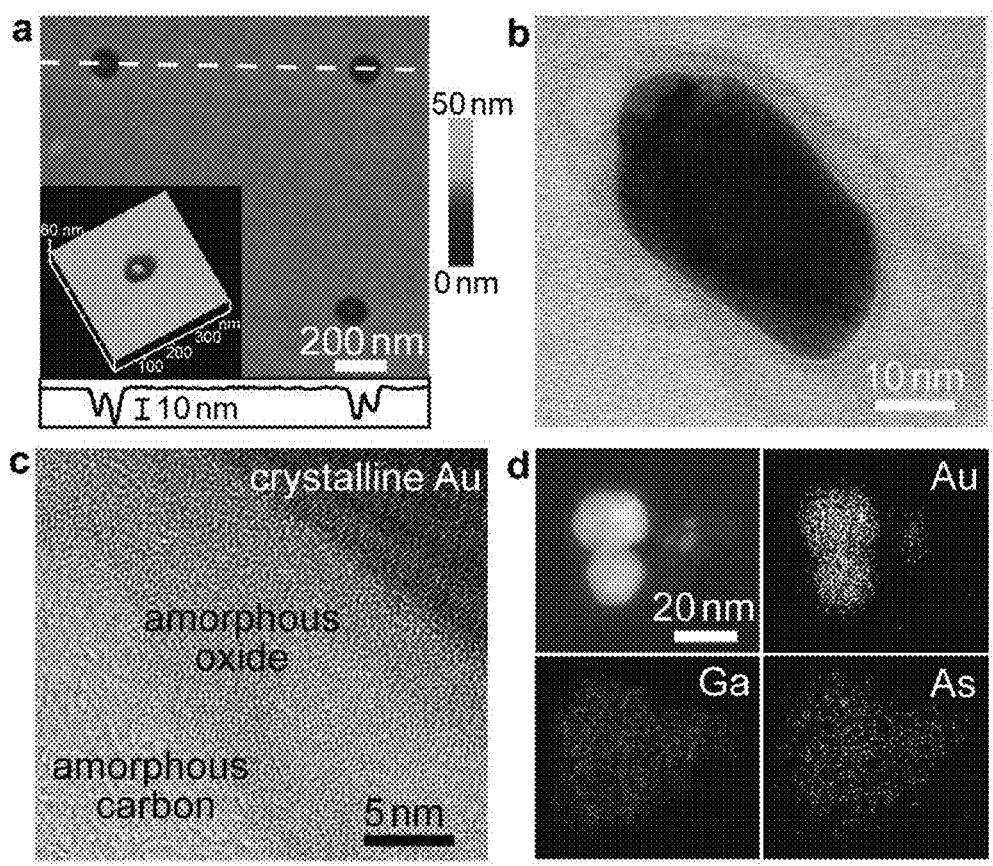

FIG. 2C further indicated the presence of a dark region surrounding each Au particle that could be caused by chemical or morphological modifications. FIG. 3A shows AFM images which characterized the detailed surface morphology of patterned Au arrays. The AFM results showed that each Au nanoparticle resided inside an etched pit that was formed during the galvanic process. The average depth of the pits was 16.0 nm and average height of the Au nanoparticles was 11.4 nm. These dimensions revealed that the particles were embedded inside the pits, rather than protruding outward. Notably, no etched pits were observed for unpatterned substrates, implying that the patterning of the substrate significantly altered the deposition condition of the Au nanoparticles during the galvanic reaction. Since no separate etching step was involved in the deposition process, the observed pits were a consequence of the galvanic reaction. Transmission electron microscopy (TEM) and X-ray photoemission spectrometry (XPS) were used to characterize the Au nanoparticles and the surface of the GaAs substrates after the galvanic reaction. FIG. 3B shows a TEM image of an Au nanoparticle removed from EBL-defined substrate, indicating that the nanoparticle was covered by an amorphous layer. FIG. 3C shows a high-resolution TEM image recorded at the edge of the Au nanoparticle. Three distinguishing areas were observed in FIG. 3C: the crystalline Au nanoparticle, an amorphous layer surrounding it, and amorphous carbon from the TEM grid. FIG. 3D shows dark-field scanning TEM (STEM) revealing contrast indicative of variations in the chemical composition. Energy-dispersive x-ray spectroscopy (EDS) elemental mapping of the same region confirmed that Au was covered by a Ga— and As-containing layer. The quantitative EDS analysis showed that the layer around the nanoparticles was mainly composed of Ga, As, and oxygen with the elemental concentration of Ga higher than that of the As. Finally, XPS investigation of the surface composition and chemical bonding states of the GaAs surface after galvanic reaction showed the compositions of the gallium and arsenic oxide were mainly composed of digallium trioxide ($Ga_2O_3$) and diarsenic trioxide ($As_2O_3$).

Figure 5:
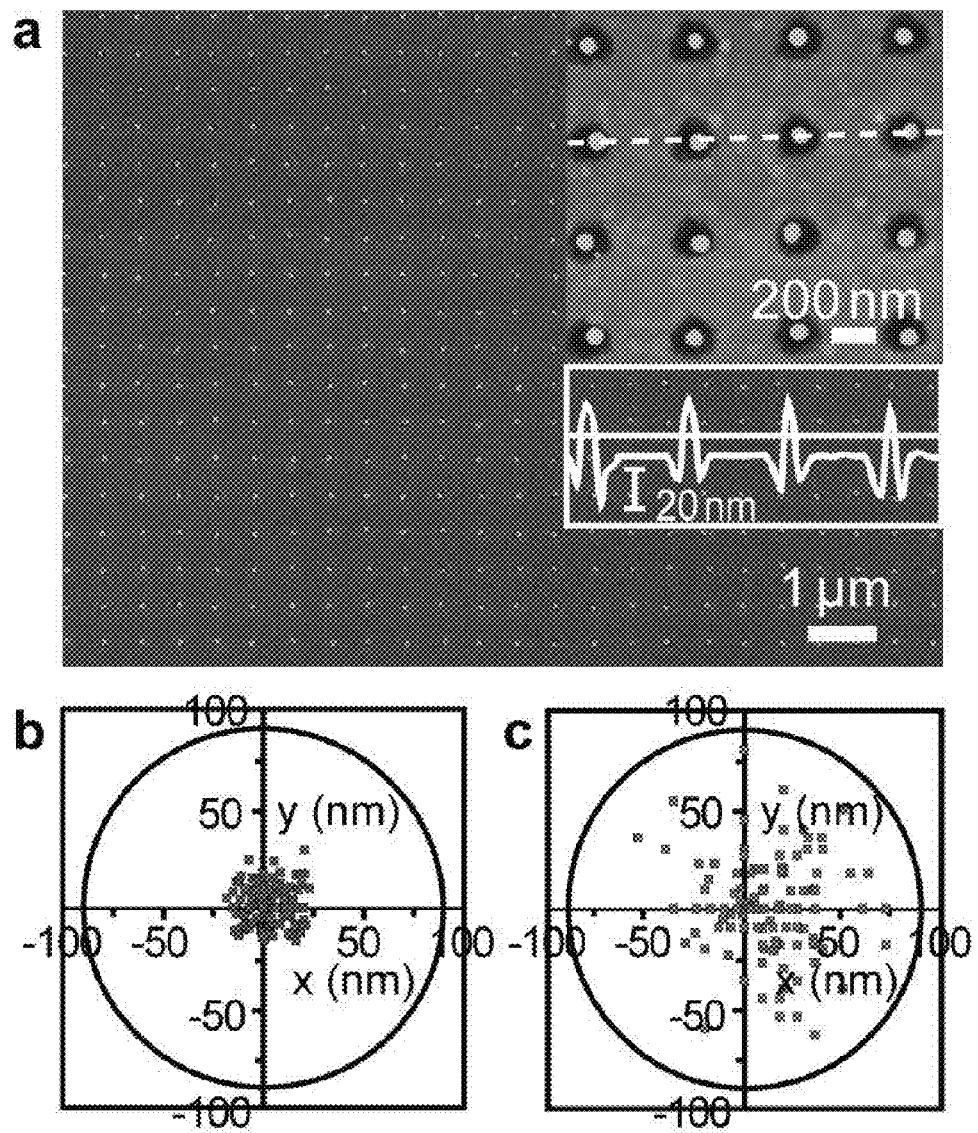
FIG. 5A is a SEM image of a dot array after the high temperature annealing process. Insets are the corresponding AFM image and height profile showing the Au particles remained inside the pits during the annealing process.
FIG. 5B is a superimposed plot showing the position of Au nanoparticles before the annealing treatment from their EBL-defined position ((x,y)=0).
FIG. 5C is a superimposed plot showing the position of Au nanoparticles after the annealing treatment from their EBL-defined position ((x,y)=0).
Figure 6:
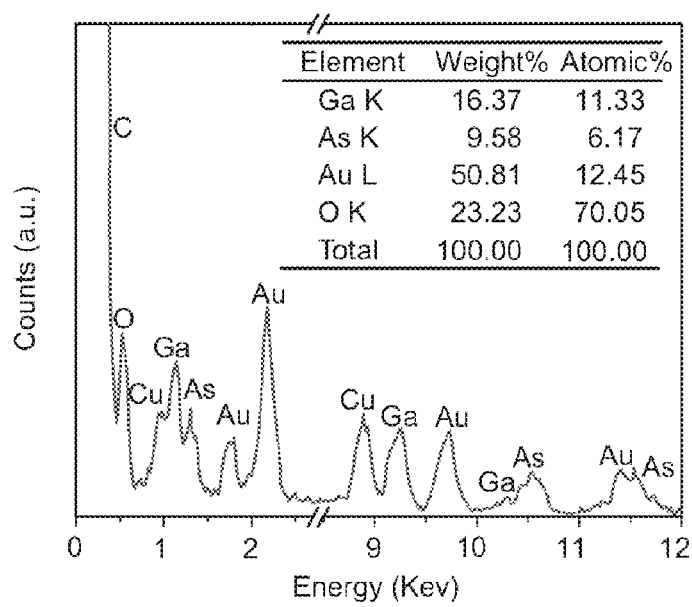
FIG. 6 is an EDS spectra of the nanoparticle shown in FIG. 3B which indicates the layer around Au nanoparticles is mainly comprised of Ga, As, and O (the C and Cu signals observed in EDS spectra originate from the carbon-coated TEM copper grid). The inset is the quantitative EDS analysis showing that the elemental concentration of the Ga is higher than that of As demonstrating the oxide surrounding the Au nanoparticle is Ga-rich.
Figure 7:
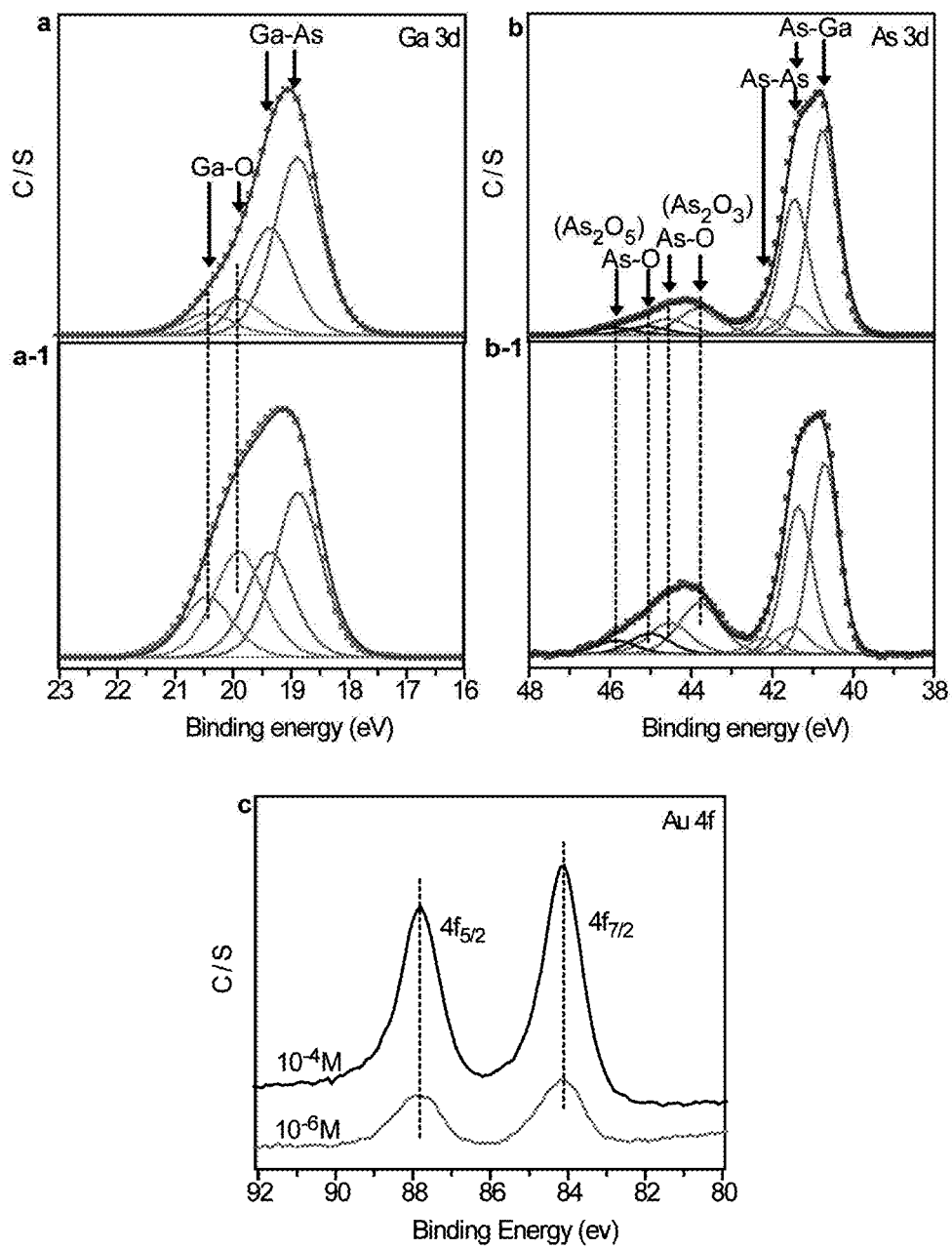
FIG. 7A is the Ga 3d XPS core level spectra of the GaAs substrate followed by applying the galvanic reaction with the $Au^{3+}$ reaction concentration of $10^{-6}$ M (top) and $10^{-4}$ M (bottom).
FIG. 7B is the As 3d XPS core level spectra of the GaAs substrate followed by applying the galvanic reaction with the $Au^{3+}$ reaction concentration of $10^{-6}$ M (top) and $10^{-4}$ M (bottom).
FIG. 7C is the Au 4f spectrum.

FIG. 5A shows SEM and AFM images of the particle array after the annealing process. Almost all of the Au nanoparticles remained in their initial position over a 50×50 $\mu m^2$ area. The etched pits created through the galvanic reaction successfully prevented the Au nanoparticle diffusion during the high temperature anneal. Quantitative analysis of AFM images before the annealing step showed that the average size of Au nanoparticles was 76±5 nm and they were formed in the middle of the etched pits with an average size of 200±9 nm. FIG. 5B is a superimposed plot showing the position of Au nanoparticles before the annealing treatment from their EBL-defined position ((x,y)=0). Most of the nanoparticles (~95%) were located within 25 nm from their EBL-defined origin. During the annealing process the nanoparticles remained confined in the corresponding pits, but small diffusion within the pit was possible. FIG. 5C is a superimposed plot showing the position of Au nanoparticles after the annealing treatment from their EBL-defined position ((x,y)=0). The majority of nanoparticles were located within 60 nm from their EBL-defined origin.

Galvanic reactions have been previously used for synthesis of metal nanoparticles, thin films, metal and semiconductor nanowires, but no precise position control or etching phenomenon on the substrates has been reported to date. See, for example, Aizawa, M. & Buriak, J. M., Block copolymer-templated chemistry on Si, Ge, InP, and GaAs surfaces. *J. Am. Chem. Soc.* 127, 8932-8933 (2005); Nezhad, M. R. H., Aizawa, M., Porter, L. A., Ribbe, A. E. & Buriak, J. M., Synthesis and patterning of gold nanostructures on InP and GaAs via galvanic displacement. *Small* 1, 1076-1081 (2005); Gao, D. et al., Selective growth of Si nanowire arrays via galvanic displacement processes in water-in-oil microemulsions. *J. Am. Chem. Soc.* 127, 4574-4575 (2005); Magagnin, L., Maboudian, R. & Carraro, C., Selective deposition of thin copper films onto silicon with improved adhesion. *Electrochem. Solid-State Lett.* 4, C5-C7 (2001), each of which is incorporated by reference in its entirety. Formation of etch pits during the particle synthesis, observed on EBL-defined surfaces but not unpatterned surfaces, indicated the substrate material was locally consumed during the galvanic reaction. During this process, $Au^{+3}$ accepted electrons from the GaAs substrate and initiated the growth of Au particles, accompanied by the formation of the $Ga_2O_3$ and $As_2O_3$ around the Au nanoparticles, as described in equation (1):

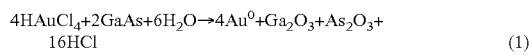

$$4HAuCl_4 + 2GaAs + 6H_2O \rightarrow 4Au^0 + Ga_2O_3 + As_2O_3 + 16HCl \quad (1)$$

The resulting $Ga_2O_3$ was insoluble in aqueous solutions with pH value between 6 and 7 and was only water soluble with the presence of strong acid or base. See, for example, Song, Y. Y., Gao, Z. D., Kelly, J. J. & Xia, X. H., Galvanic deposition of nanostructured noble-metal films on silicon. *Electrochemical and Solid State Letters* 8, C148-C150 (2005); and Aizawa, M. & Buriak, J. M., Block copolymer templated chemistry for the formation of metallic nanoparticle arrays on semiconductor surfaces. *Chemistry of Materials* 19, 5090-5101 (2007), each of which is incorporated by reference in its entirety. Some HCl was produced during the reaction (equation (1)), but the pH value of the solution remained around 6 due to the very low concentrations of $HAuCl_4$ that were used (from $10^{-4}$ M to $10^{-6}$ M) for the reaction. $As_2O_3$, however, is easily soluble in water:

$$As_2O_3 + 3H_2O \rightarrow 2H_2AsO_3^- + 2H^+ \quad (2)$$

See, for example, Song, J. S. et al., Wet chemical cleaning process of GaAs substrate for ready-to-use. *Journal of Crystal Growth* 264, 98-103 (2004), which is incorporated by reference in its entirety.

Figure 4:
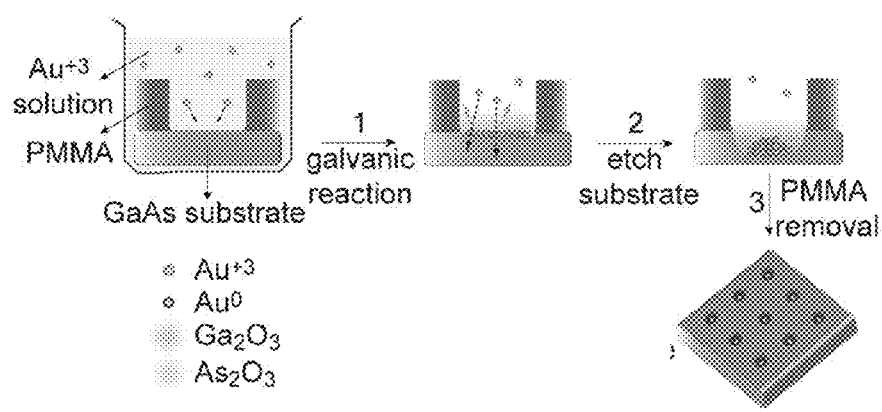
FIG. 4 is a schematic illustration of the growth mechanism of Au nanoparticles during the galvanic reaction.

Therefore, most of the subsequent oxide accompanied by the growth of Au nanoparticles on the surface of GaAs substrate was Ga-rich oxide ($Ga_2O_3$), as confirmed by XPS. The dissolution of $As_2O_3$ kept the reaction proceeding and continuously consumed the Ga and As from the surface of GaAs substrate. On the unpatterned substrates, the process proceeded at any location on the surface with abundant Ga and As supply, and no significant variation in the morphology of the substrate was produced. However, on the patterned substrate, the supply of Ga and As was restricted to the exposed areas of the substrate, resulting in the formation of etched pit around the Au nanoparticles (depicted as step 1 to 3 in FIG. 4). The overall reaction ceased when a layer of $Ga_2O_3$ formed, covering the surface of the GaAs substrate and the Au nanoparticles. The oxide layer halted electrons transfer and prevented $Au^{+3}$ ions in the solution from contacting the pristine GaAs surface to continue the reaction. The substrate etching effect became significant when sufficient metal ions were supplied on a limited area and the produced oxides were efficiently dissolved to keep the reaction proceeding on the semiconductor substrate. Therefore, the combination of EBL and the galvanic process made a unique route to synthesize catalytic Au nanoparticles with well-defined size and position.

Results obtained from SEM images showed the versatility of applying galvanic reaction to fabricate high quality Au patterns without any adhesive layers. Moreover, for the patterned substrates, the in situ created pits surrounded the Au nanoparticles during the galvanic reaction helped to stabilize the nanoparticles throughout the high temperature annealing. This technique can enabled fabrication of uniform ordered arrays of vertical GaAs nanowires. The method described here can be further extended to other metal systems used as nanowire catalysts, such as silver (Ag), copper (Cu) and nickel (Ni), as well as other substrates such as silicon, sapphire, or GaN to simplify the future fabrication procedures of nanowire devices. By combining other lithographic or self-assembly techniques with the galvanic process, ordered arrays of robust metal nanostructures could be achieved for applications in nanoplasmonics or molecular electronics.

Other embodiments are within the scope of the following claims.

What is claimed is:

1. A method of growing a nanoparticle on a substrate comprising contacting a predetermined region of a semiconductor substrate with a solution including noble metal ions,
   wherein contacting a predetermined region of a semiconductor substrate with a solution including noble metal ions comprises forming a nanoparticle on the semiconductor substrate, the nanoparticle being laterally separated from other nanoparticles in predetermined positions on the semiconductor substrate by a barrier; and the barrier is a portion of the semiconductor substrate that is raised relative to the region of the semiconductor substrate upon which the nanoparticle is positioned
   wherein the nanoparticle is positioned in a pit in a surface of the semiconductor substrate, the pits having sidewalls that form in the surface of the semiconductor substrate.

2. The method of claim 1, further comprising exposing the predetermined region of the semiconductor substrate, wherein exposing includes applying a polymeric layer over the semiconductor substrate; and
   selectively removing a portion of the polymeric layer.

3. The method of claim 1, wherein the substrate includes GaAs.

4. The method of claim 2, wherein the polymeric layer includes PMMA.

5. The method of claim 1, wherein the noble metal is Au.

6. The method of claim 1, wherein the nanoparticle is a nanocrystal.

7. The method of claim 1, wherein contacting a predetermined region of a semiconductor substrate with a solution including noble metal ions includes selecting conditions for a galvanic reaction between the semiconductor substrate and the noble metal ions.

8. The method of claim 1, wherein exposing a portion of the substrate through the polymeric layer comprises e-beam lithography.

9. The method of claim 1, wherein the nanoparticle is a member of a nanoparticle population having an average diameter of 25 nm or smaller, or of 10 nm or smaller.

10. The method of claim 1, wherein the nanoparticle is positioned in a pit on the substrate.

11. The method of claim 2, wherein selectively removing a portion of the polymeric layer comprises forming a pattern.

12. The method of claim 11, wherein the pattern is an array of openings.

13. The method of claim 12, wherein the openings in the array have a dimension of 1 nm or less, 5 nm or less, 10 nm or less, 25 nm or less, or a larger dimension.

14. The method of claim 1, wherein the average diameter of the nanoparticle is 25 nm or smaller.

15. The method of claim 1, wherein the average diameter of the nanoparticle is 10 nm or smaller.

16. The method of claim 10, further comprising etching a portion of the semiconductor substrate to form the pit.

* * * * *